United States Patent [19]

Quadir et al.

[11] Patent Number: 5,496,682
[45] Date of Patent: Mar. 5, 1996

[54] THREE DIMENSIONAL SINTERED INORGANIC STRUCTURES USING PHOTOPOLYMERIZATION

[75] Inventors: Tariq Quadir, Columbia; Srinivas K. Mirle; John S. Hallock, both of Ellicott City, all of Md.

[73] Assignee: W. R. Grace & Co.-Conn., New York, N.Y.

[21] Appl. No.: 138,511

[22] Filed: Oct. 15, 1993

[51] Int. Cl.$^6$ ......................................................... G03C 5/00
[52] U.S. Cl. ........................ 430/269; 430/281.1; 522/71; 522/83
[58] Field of Search ..................................... 430/269, 281; 522/71, 83

[56] References Cited

U.S. PATENT DOCUMENTS

| | | | |
|---|---|---|---|
| 4,575,330 | 3/1986 | Hull | 425/174.4 |
| 4,752,498 | 6/1988 | Fudim | 427/54.1 |
| 4,801,477 | 1/1989 | Fudim | 427/54.1 |
| 4,828,961 | 5/1989 | Lau et al. | 430/311 |
| 4,844,144 | 7/1989 | Murphy et al. | 164/35 |
| 4,942,001 | 7/1990 | Murphy et al. | 264/22 |
| 4,942,060 | 7/1990 | Grossa | 427/54.1 |
| 4,961,154 | 10/1990 | Pomerantz et al. | 364/522 |
| 5,126,529 | 6/1992 | Weiss et al. | 219/121.6 |
| 5,167,882 | 12/1992 | Jacobine et al. | 264/22 |
| 5,198,159 | 3/1993 | Nakamura et al. | 264/22 |
| 5,207,371 | 5/1993 | Prinz et al. | 228/125 |

FOREIGN PATENT DOCUMENTS

| | | |
|---|---|---|
| 0378144 | 7/1990 | European Pat. Off. . |
| 0450254 | 10/1991 | European Pat. Off. . |
| 0506616 | 9/1992 | European Pat. Off. . |
| 0517657 | 12/1992 | European Pat. Off. . |
| 499203 | 3/1992 | Japan . |
| 9202572 | 2/1992 | WIPO . |
| 9220014 | 11/1992 | WIPO . |

OTHER PUBLICATIONS

Surface Coatings—1, Edited by Alan D. Wilson, John W. Nicholson Laboratory of the Government Chemist and Havard J. Prosser of Warren Spring Laboratory all of United Kingdom; Elsevier Applied Science pp. 222–225, 1987.

*Primary Examiner*—Mark Chapman
*Attorney, Agent, or Firm*—Mary Ann Capria

[57] ABSTRACT

Dense sintered parts of ceramic and/or metallic materials are formed using stereo photolithography. An initial flowable mixture of sinterable inorganic particles, photocurable monomer, photoinitiator and dispersant is flowed over a substrate and cured in a selective pattern. Subsequent layers of the mixture are flowed over the substrate and cured to build a three dimensional body. The body is then fired to produce a dense sintered part. Parts having in excess of 95% of theoretical density can be produced.

12 Claims, No Drawings

THREE DIMENSIONAL SINTERED INORGANIC STRUCTURES USING PHOTOPOLYMERIZATION

BACKGROUND OF THE INVENTION

Traditionally, sintered inorganic materials such as ceramics, metals or composites thereof (cermets) have been formed by molding a powder of the material into a desired three dimensional shape, recovering the shape from the mold and subsequently firing the shape. In the traditional sintering process, much expense goes into the molding process. For example, in injection molding, a suitable mold must first be created from a material capable of withstanding the injection molding process. In pressing or extrusion processes, appropriate dies must be selected or made by machining. The traditional molding processes generally require substantial capital investment in equipment to produce molded parts on an industrial scale.

Some attention has been given toward efforts to eliminate the need for molding in the formation of three dimensional parts. Various processes are discussed in U.S. Pat. Nos. 5,207,371 and 5,126,529. Japanese Laid-Open Patent Application 04-099,203 discusses the use of photocurable organic materials to make ceramic or metallic structures by what appears to be a photolithographic process, but the Application does not give any detail as to how this is to be achieved in a stereo photolithography (also called "stereolithography") process.

Stereo photolithography is a method which has been used for making prototype plastic parts. This method is discussed in U.S. Pat. No. 4,575,330, the disclosure of which is incorporated herein by reference. Stereo photolithography involves the formation of a thin layer of liquid photopolymerizable on a substrate. Once the layer is formed, it is selectively exposed to curing radiation (typically UV) via a scanning laser. Once the desired portion of the liquid layer is cured an additional liquid layer is flowed over the first cured layer. The second liquid layer is then scanned with the curing laser to form a second layer of cured photopolymer. This process is repeated a multitude of times to build up a cured polymer body. Typically, the laser is computer programmed to scan the layer-by-layer patterns corresponding to the desired shape.

In a typical stereo photolithography apparatus, the substrate is immersed in a bath of the photopolymerizable organic liquid such that the top surface of the substrate is covered with a thin layer of the liquid. Once the thin layer is scanned to cure the desired regions (while the substrate is still in the bath), the substrate is lowered deeper into the bath whereby additional photopolymerizable organic liquid flows over the first cured layer to form another thin layer of liquid which is then scanned with the laser. The lowering of the substrate into the photopolymerizable liquid can also be computer programmed such that virtually the entire stereo photolithography process can be automated. In this way, stereo photolithography has been capable of producing intricate prototype plastic parts in a matter of hours without the need for mold making or machining.

The use of photocuring techniques such as stereo photolithography has largely been limited by the need for substantial flowability of the photocuring material. As a result, this technique has not been used to make dense sintered parts of inorganic materials.

SUMMARY OF THE INVENTION

The invention provides a method of forming dense parts from sinterable inorganic materials using stereo photolithography. The invention also provides compositions suitable for use in stereo photolithography as well as in other photocuring processes to produce three dimensional sintered ceramic and/or metallic bodies.

In one aspect, the invention encompasses the formation of dense sintered bodies of ceramic, metal and/or metal alloy by stereo photolithography. The method of forming a three dimensional sintered ceramic, metallic or cermet (ceramic/metallic composite) body, comprises:

a) combining sinterable particles selected from the group consisting of ceramics, metals, metal alloys and mixtures thereof with a photocurable monomer, a photoinitiator, and a dispersant to produce a flowable liquid, b) flowing a portion of the flowable liquid onto a substrate to form a first layer, c) exposing the first layer to electromagnetic radiation suitable for curing the photomonomer into a solid polymer, whereby a selected portion of the first layer is cured, and d) flowing another portion of the flowable liquid onto the cured first layer to form at least one additional layer on the cured first layer, e) exposing the additional layer to electromagnetic radiation suitable for curing the photomonomer into a solid polymer, whereby a selected portion of said additional layer is cured, thereby forming a cured laminate with the cured first layer, and f) firing the laminate whereby the polymer is removed and the sinterable particles are sintered to form a dense body.

Preferably, the electromagnetic radiation is in the form of a scanning laser. The flowing of the liquid is preferably accomplished by lowering the substrate in a bath of the liquid whereby the liquid flows over the top surface of the substrate. The process of layer building is preferably repeated several times to build up a three dimensional body of a desired shape.

In a further aspect, the invention encompasses photocurable compositions suitable for the formation of three dimensional sintered bodies by stereo photolithography, the composition comprising:

| | |
|---|---|
| 40–70 vol. % | sinterable ceramic and/or metallic particles, |
| 10–35 wt. % | photocurable monomer based on the weight of the sinterable particles, |
| 1–10 wt. % | photoinitiator based on the weight of the monomer, and |
| 1–10 wt. % | dispersant based on the weight of the sinterable particles. |

The compositions of the invention may also contain compatible plasticizers and/or coupling agents. These and other aspects of the invention will be described further below.

DETAILED DESCRIPTION OF THE INVENTION

The invention provides a method of forming dense three dimensional sintered parts directly from mixtures of sinterable inorganic particles any a photocurable organic material using stereo photolithography.

The method comprises:

a) combining sinterable particles selected from the group consisting of ceramics, metals, metal alloys and mixtures thereof with a photocurable monomer, a photoinitiator, and a dispersant to produce a flowable liquid, b) flowing a portion of the flowable liquid onto a substrate to form a first layer, c) exposing the first layer to electromagnetic radiation suitable for curing the photomonomer into a solid polymer, whereby a selected portion of the first layer is cured, and d) flowing another portion of the flowable liquid onto the cured first layer to form at least one additional layer on the cured first layer, e) exposing the additional layer to electromagnetic radiation suitable for curing the photomonomer into a solid polymer, whereby a selected portion of said additional layer is cured, thereby forming a cured laminate with the cured first layer, and f) firing the laminate whereby the polymer is removed and the sinterable particles are sintered to form a dense body.

Preferably, steps d) and e) are repeated to form a laminate of at least three layers. More preferably, steps d) and e) are repeated to form a multitude of layers which together constitute a three dimensional body of the desired shape.

While any suitable technique may be used to form the flowable liquid in step a), preferably the sinterable particles are first combined with an organic solvent (such as isopropanol) and the dispersant. The monomer and photoinitiator are then added to the mixture. The mixture may be blended using any suitable mixing means (e.g. milling). After mixing, the solvent is then preferably substantially or completely removed by evaporation, thereby resulting in the flowable liquid. In some cases where the monomer/initiator system used is of sufficiently low viscosity, the use of a solvent may be omitted.

If a plasticizer is used, preferably it is added to the mixture with the monomer and initiator. If a coupling agent is used, preferably it is combined with the sinterable particles before addition of the monomer and initiator. Other known expedients such as defoaming agents may be added to the flowable liquid during step a) as long as they are compatible with the other ingredients.

Once the flowable liquid containing the photocurable organic system and the sinterable particles is formed, preferably it is placed into a bath. The substrate is then preferably immersed into the bath so the top surface of the substrate is covered with a liquid layer a desired thickness. The thickness of the liquid layer is controlled by controlling the depth of immersion of the substrate in the bath. In a typical stereo photolithography set up, the immersion depth is controlled by a computer which can be programmed to incrementally lower the substrate in the bath in coordination with the rest of the process.

The desired thickness of the liquid layer may vary depending on the ease of cure of the liquid, the desired precision of the stereo photolithographic layering, the intricacy of the desired shape, etc. Layer thicknesses may range up to several mils. Preferably, the layer thickness is about 0.1–10 mils (2.5–250 µm). The time needed for the desired flow to occur will depend on the viscosity of the liquid, the width of the top surface to be covered, the layer thickness desired and possibly other factors. In general, it is desirable that the time for flow of the layer be as brief as possible. Preferably, the time to form the liquid layer is less than one minute, more preferably less than 30 seconds. Shorter flow times speed up the process and/or allow the formation of more precise features in a given amount of processing time.

Once the liquid layer is formed, it is selectively exposed to electromagnetic radiation of a wavelength suitable for curing the monomer/initiator system. Preferably, the radiation is in the ultraviolet (UV) spectrum. More preferably, the radiation has a wavelength of about 300–400 nm. While any suitable means of applying the radiation to selective areas of the liquid layer may be used, preferably the radiation is applied by one or more scanning lasers. The required exposure time needed may vary depending on the composition of the liquid, the power output of the laser, etc.

Once the desired portions of the layer are cured by exposure to the radiation, the substrate is then immersed deeper into the liquid bath whereby another layer of liquid is flowed over the first cured layer. A similar procedure would be followed to selectively expose the second liquid layer to radiation in order to selectively cure the desired portions of the second layer. The two cured layers would then effectively form a cured laminate.

The layering process may be repeated any desired number of times to form the three dimensional cured shape. The number of layers formed may depend on the desired precision in the features of the shape, the size of the shape and the maximum curable thickness of the liquid.

In most stereo photolithography apparatus, the laser scanning is controlled by computer. The shape of the part to be formed is preferably entered into the computer (e.g. by use of computer graphics or CAD/CAM). The computer would then be programmed to generate the corresponding shape in the desired precision. Once the shape and various other parameters are input into the computer, the shape can be formed from the liquid in a completely automated manner.

Once the cured shape has been formed, the shape is removed from the stereo photolithography apparatus. Any excess liquid may be removed from the surface of the shape by any suitable method. For example, the shape may be washed lightly with a solvent such as isopropanol. Preferably, the shape is then dried and post-cured by exposure to flood UV radiation in a UV curing oven to cure any remaining uncured monomer. The cured shape is then fired to remove the photopolymer from the cured shape and to sinter the sinterable inorganic particles. The heating rate during the photopolymer removal is preferably done at a rate of about 0.1°–1.0 ° C./min. to about 500°–650° C. Once the polymer is removed, the shape is then heated to a sintering temperature appropriate for the inorganic material(s) to be sintered. Preferably, the sintering is conducted to the point that the body has a density of at least 90% of the theoretical maximum density for the sinterable material, more preferably to at least 95% of theoretical density, most preferably at least 98% theoretical density.

The photocurable compositions of the invention are especially suitable for the formation of three dimensional sintered bodies by stereo photolithography, These compositions have the advantageous combination of good flowability with high volume % loading of sinterable particles. The compositions may also be used in other photocuring processes such as the process disclosed in U.S. Pat. No. 4,961,154. The compositions of the invention comprise:

| | |
|---|---|
| 40–70 vol. % | sinterable ceramic and/or metallic particles, |
| 10–35 wt. % | photocurable monomer based on the weight of the sinterable particles, |
| 1–10 wt. % | photoinitiator based on the weight of the monomer, and |
| 1–10 wt. % | dispersant based on the weight of |

-continued the sinterable particles.

The sinterable particles may be any sinterable ceramic, metal, metal alloy or compatible combination thereof. The sinterable material may be crystalline and/or amorphous. If desired, the sinterable material may include a sintering aid. In the selection of the sinterable materials, it is generally desirable to avoid the use of materials which have a significant capacity to absorb the wavelength of radiation used to cure the monomer/initiator system; otherwise, curing of the composition may be severely inhibited. Preferred ceramic materials are oxide ceramics, such as alumina or zirconia, and nitrides such as silicon nitride. Examples of suitable preferred metallic materials include stainless steel, refractory metal powders, and the like.

The sinterable particles should be of a size suitable for sintering to high density. While smaller sinterable particles can have more favorable sintering characteristics, they also have a greater tendency to undesirably increase the viscosity of the composition. Preferably, the sinterable particles have an average particle size of about 0.3–3.0 μm, more preferably about 0.5–1.5 μm. Preferably, the sinterable particles have a low surface area so as to minimize any viscosity increase caused by high volume % loading in the composition. To achieve a dense sintered part, a sufficient green density (volume fraction of sinterable material) is needed in the cured shape. Preferably, the volume % loading in the composition is about 40–60 vol. %, more preferably about 50–60 vol. %. While the volume % loading can be increased further, higher loadings result in greater viscosity of the liquid and lengthen the time needed for production of the cured shape. The compositions of the invention are advantageously capable of achieving 40–70 vol. % loadings while keeping the viscosity at an acceptably low level.

The photocurable monomer may be any suitable monomer or combination of monomers which form a polymer of sufficient strength and a liquid composition of sufficiently low viscosity. The monomers are preferably polyfunctional acrylates. Acrylates with difunctionality tend to result in lower solution viscosity, but may take longer time/energy to cure to an adequate strength. Acrylates with higher functionality (e.g. trifunctional— pentafunctional) tend to be more easily cured to higher strength, but also tend to result in higher viscosity. In some cases, a combination of monomers may be used. For example, the addition of a relatively minor amount of higher functionality monomer to a difunctional monomer may result in improved curability and cured body strength. Preferred monomers are selected from the group consisting of 2(2-ethoxyethoxy) ethylacrylate, trimethylolpropane triacrylate, ethoxylated trimethylolpropane triacrylate, and mixtures thereof. The amount of monomer in the composition may vary depending on the nature of the sinterable material, the specific monomer(s) selected, the desired composition viscosity, and the other additives in the composition. Preferably, the composition contains about 10–35 wt. % of photocurable monomer based on the weight of the sinterable particles.

The photoinitiator may be any suitable initiator for the given monomer system selected. Typically, the selection of the photoinitiator will dictate the spectrum of radiation wavelengths suitable for photocuring. If desired, a combination of photoinitiators may be used. Preferred initiators are selected from the group consisting of trimethyl benzophenone, alpha hydroxyketone, isopropylthioxanthone, 2-methyl-1-[4(methylthio)phenyl]]-2-morpholinopropanone-1 and mixtures thereof. The amount of photoinitiator used is preferably an amount in the range conventionally used for the monomer system selected. Preferably, the amount of photoinitiator in the composition is about 1–10 wt. % based on the weight of the photocurable monomer. The initiators typically are active in the ultraviolet 300–400 nm wavelength spectrum.

The use of a suitable dispersant is important to the achievement of flowable compositions having the loading of sinterable material necessary to obtain a dense part upon sintering. The dispersant may be any compatible dispersant for use with the monomer/initiator system selected. Generally, the dispersant should be one suitable for dispersing ceramic particles in an organic medium. Preferably, the dispersant is an amine dispersant such as HYPERMER KD-2 sold by ICI Americas or a fatty acid derivative such as TEXAPHOR 963 sold by Henkel. The amount of dispersant used is preferably about 1–10 wt. % based on the weight of the sinterable material, more preferably about 3–8 wt. %.

Preferably, the various components are combined to achieve a composition viscosity of less than 3000 centipoise, more preferably, the viscosity is less than 1000 centipoise.

In order to obtain further improvements in viscosity at high particle loading and/or to enable use of monomer/initiator systems having less favorable intrinsic viscosity characteristics, but otherwise better performance characteristics, plasticizers and/or coupling agents may be added to the composition.

The plasticizer may be any suitable material capable of plasticizing the cured photopolymer without unacceptably adversely affecting the other properties of the composition or its behavior in the stereo photolithography process including the firing step. If a large proportion of the monomer has a high degree of functionality, a plasticizer may act to reduce the viscosity of the system to more useful levels and may reduce the occurrence of brittleness in the cured shape. Preferred plasticizers are oleates such as glycerol trioleate or glycols such as tripropylene glycol. The amount of plasticizer used is preferably about 20–40 wt. % based on the weight of photocurable monomer. Preferably, excessive amounts of plasticizer are avoided in order to avoid excessive degradation of the photocuring properties of the system and to keep volume of sinterable material in the composition at an acceptably high level.

The coupling agent may be any agent for interacting with the sinterable particles without adversely affecting the photocuring performance of the monomer/initiator system. Further, the coupling agent preferably does not leave residual materials in the body which adversely affect the sintering or the quality of the resulting sintered product. Preferred coupling agents are silanes. Particularly preferably coupling agents are silanes selected from the group consisting of gamma-methacryloxypropyltrimethoxysilane and 3-acryloxypropyltrimethoxysilane and mixtures thereof. The amount of coupling agent used is preferably about 0.5–2.0 wt. % based on the weight of the sinterable material. The coupling agents can result in reduced viscosity at constant particle loading (or higher loading at constant viscosity) and improved curability of the monomer/initiator system (i.e. reducing the amount of energy needed to adequately cure).

As noted above, solvent may be used in the course of preparation of the compositions of the invention. Preferably, most or all of the solvent is removed from the composition before use in any photocuring/sintering process. Other known expedients such as anti-foaming agents may be added to the compositions as long as they are compatible with the other composition ingredients.

The invention is further illustrated by the following examples. The invention is not limited to the specific details of the examples.

EXAMPLE 1

600 g of alumina particles (ave. particle size 1.5 μm) were combined with 100 g ethoxylated trimethylolpropane triacrylate monomer (Sartomer 454), 39 g amine dispersant (ICI's HYPERMER KD-2), 7.2 g silane coupling agent (A-174), 32 g glycerol trioleate plasticizer and 90 g isopropanol to produce a mixture. After two hours of mixing, 5 g alpha hydroxyketone photoinitiator (ESACURE KIP100F) was added. The isopropanol was then allowed to evaporate to give the liquid for use in the layer forming process. The liquid was then flowed over a substrate to form a 5 mil layer which was then selectively cured by a scanning 50 mW laser. Additional layers were flowed and cured in a similar manner to build up a cured laminate in the shape of a 2 inch by 0.12 inch bar which was about 0.4 inches thick.

The bar shape was washed with isopropanol to remove residual liquid. The bar was then dried and further exposed to flood UV radiation (890 mJ/cm$^2$) to cure remaining uncured monomer. The bar was then heated at a rate of about 0.1°–1.0 °C./min. to about 500°–650° C. to remove the photopolymer. The heating was continued to 1660° C. where the temperature was held for two hours. The resulting alumina bar had 98% of the theoretical density.

EXAMPLE 2

170 g of tetragonal zirconia particles (ave. particle size 0.5 μm) were combined with 20 g 2(2-ethoxyethoxy) ethylacrylate monomer (Sartomer 256), 5.4 g amine dispersant (ICI's HYPERMER KD-2), and 1.5 g silane coupling agent (A-174) to produce a mixture. After two hours of mixing, 1 g photoinitiator (Sartomer KB-1) and 0.5 g trimethyl benzophenone photoinitiator (ESACURE TZT) were added to give the liquid for use in the layer forming process. The liquid was then flowed over a substrate to form a 1.5 mil layer which was then selectively cured by a scanning 8 mW laser. Additional layers were flowed and cured in a similar manner to build up a cured laminate in the shape of a 2 inch by 0.12 inch bar which was about 0.4 inches thick.

The bar shape was washed with isopropanol to remove residual liquid. The bar was then dried and further exposed to flood UV radiation (890 mJ/cm$^2$) to cure remaining uncured monomer. The bar was then heated at a rate of about 0.1°–1.0° C./min. to about 500°–650° C. to remove the photopolymer. The heating was continued to 1510° C. where the temperature was held for two hours. The resulting tetragonal zirconia bar had 98.7% of the theoretical density.

What is claimed is:

1. A photocurable composition suitable for the formation of three dimensional sintered bodies by stereo photolithography, said composition comprising:
   - 40–70 vol. % sinterable ceramic and/or metallic particles,
   - 10–35 wt. % photocurable monomer based on the weight of the sinterable particles,
   - 1–10 wt. % photocurable monomer based on the weight of the monomer,
   - 1–10 wt. % dispersant based on the weight of the sintered particles, and a coupling agent.

2. The composition of claim 1 wherein said composition further contains a plasticizer.

3. The composition of claim 2 wherein said plasticizer is present at about 20–40 wt. % based on the weight of said monomer.

4. The composition of claim 2 wherein said plasticizer is selected from the group consisting of tripropylene glycol and glycerol trioleate.

5. The composition of claim 1 wherein said monomer comprises one or more acrylates.

6. The composition of claim 5 wherein said monomer includes a monomer selected from the group consisting of 2(2-ethoxyethoxy) ethylacrylate, trimethylolpropane triacrylate, ethoxylated trimethylolpropane triacrylate, and mixtures thereof.

7. The composition of claim 1 wherein said photoinitiator is selected from the group consisting of trimethyl benzophenone, alpha hydroxyketone, isopropylthioxanthone, 2-methyl-1-[4-(methylthio)phenyl]-2-morpholinopropanone-1 and mixtures thereof.

8. The composition of claim 1 wherein said dispersant is a fatty propylenediamine dioleate.

9. The composition of claim 1 wherein said coupling agent is present at about 0.5–2.0 wt. % based on the weight of said sinterable particles.

10. The composition of claim 1 wherein said coupling agent is a silane selected from the group consisting of gamma-methacryloxypropyltrimethoxysilane and 3-acryloxypropyl-trimethoxysilane and mixtures thereof.

11. The composition of claim 1 wherein said composition contains about 50–60 vol. % of said sinterable powder.

12. The composition of claim 1 wherein said sinterable particles are ceramic particles selected from the group consisting of alumina, tetragonal zirconia, silicon nitride and mixtures thereof.

* * * * *

UNITED STATES PATENT AND TRADEMARK OFFICE
CERTIFICATE OF CORRECTION

PATENT NO. : 5,496,682
DATED      : March 5, 1996
INVENTOR(S): Quadir et al

It is certified that error appears in the above-indentified patent and that said Letters Patent is hereby corrected as shown below:

Amend Claim 1, line 7, as follows:
    delete "1-10 wt.% photocurable monomer" and
    insert in lieu thereof --1-10 wt.% initiator--.

Signed and Sealed this

Twentieth Day of July, 1999

*Attest:*

Q. TODD DICKINSON

*Attesting Officer*     *Acting Commissioner of Patents and Trademarks*